United States Patent [19]

Ina et al.

[11] 4,285,322

[45] Aug. 25, 1981

[54] APPARATUS FOR CONTROLLING AN IGNITION COIL OF AN INTERNAL COMBUSTION ENGINE

[75] Inventors: Toshikazu Ina, Okazaki; Hisasi Kawai, Toyohashi; Takeshi Matsui, Aichi, all of Japan

[73] Assignee: Nippon Soken, Inc., Nishio, Japan

[21] Appl. No.: 53,847

[22] Filed: Jul. 2, 1979

[30] Foreign Application Priority Data

Jul. 5, 1978 [JP] Japan .................................. 53-81631

[51] Int. Cl.³ .............................................. F02P 3/02
[52] U.S. Cl. .................................... 123/630; 123/651
[58] Field of Search ............... 123/148 E, 117 R, 630, 123/651

[56] References Cited

U.S. PATENT DOCUMENTS

| | | | |
|---|---|---|---|
| 3,100,479 | 8/1963 | Wood | 123/148 E |
| 3,206,613 | 9/1965 | Clifton | 123/148 E |
| 3,910,247 | 10/1975 | Hartip | 123/148 E |
| 3,913,549 | 10/1975 | Crisafulli | 123/148 E |
| 3,937,193 | 2/1976 | Kim | 123/148 E |
| 3,949,722 | 4/1976 | Linstedt et al. | 123/148 E |

Primary Examiner—Charles J. Myhre
Assistant Examiner—R. A. Nelli
Attorney, Agent, or Firm—Cushman, Darby & Cushman

[57] ABSTRACT

An apparatus for controlling an ignition coil of internal combustion engines including a power transistor connected to the primary winding of an ignition coil for controlling the energization and deenergization of the primary winding in response to a signal applied to the base of the power transistor. A feedback circuit, including a constant voltage diode, a capacitor and a resistor, is connected between the collector and base of the power transistor. When the power transistor becomes conductive from a nonconductive condition, a collector current of the power transistor flows through the capacitor and constant voltage diode due to the Miller integrator effect and the transition from nonconduction to conduction of the power transistor is made gradual thereby reducing a voltage generated in the secondary winding of the ignition coil.

On the contrary, when the power transistor becomes nonconductive from the conductive condition, the constant voltage diode is rendered conductive due to a high voltage generated at the collector of the power transistor to allow a base current to flow and in turn to allow a collector current thereby preventing breakdown of the power transistor.

3 Claims, 5 Drawing Figures

APPARATUS FOR CONTROLLING AN IGNITION COIL OF AN INTERNAL COMBUSTION ENGINE

BACKGROUND OF THE INVENTION

1. Field of the Invention

This invention relates to an apparatus for controlling an ignition coil of an internal combustion engine mounted on an automobile.

2. Description of the Prior Art

It is known in the ignition system of internal combustion engines to connect the primary winding of an ignition coil for generating a spark voltage in series with a power transistor and a battery and, to excite the ignition coil during the period when the power transistor is conductive and to generate a spark voltage from the secondary winding of the ignition coil at the transition of the power transistor from conduction to nonconduction. In such a kind of system, also in the transistion of the power transistor from nonconduction to conduction, a high voltage is generated in the secondary winding of the ignition coil, because the ignition coil is excited instantly. This high voltage is not required to ignite a mixture supplied to the internal combustion engine but it gives rise to disadvantages. Because, for example, in the case of a four-cylinder internal combustion engine wherein two ignition coils are employed and two ignition plugs are connected to the secondary winding of each ignition coil, the excitation of the ignition coil is started during the intake stroke and during the compression stroke of the internal combustion engine. A serious problem arises in that when a high voltage of 2,000–3,000 volts is generated in the secondary winding of the ignition coil upon excitation thereof, the ignition plugs will be ignited at the 2,000 to 3,000 volts because the air pressure inside the cylinder is close to the atmosphere at the beginning of the intake stroke and the compression stroke, and the engine operation will be unstable.

Furthermore, as the high voltage is applied to the collector of the power transistor connected in series with the primary winding of the ignition coil at the time when an electric current in the primary coil for generating a normal spark voltage is blocked, the power transistor may be destroyed.

SUMMARY OF THE INVENTION

It is an object of the invention to provide an apparatus for controlling an ignition coil in which an excessively high voltage is suppressed from being generated in the secondary side of an ignition coil at the instant of a power transistor being made conductive from a nonconductive condition, and in which an excessively high voltage is prevented from being applied to the power transistor when a current in the primary side of the ignition coil is blocked.

In this invention a power transistor for driving the primary side of an ignition coil, and a feedback circuit including a constant voltage diode, a capacitor and a resistor is provided. The power transistor has its collector connected to one output terminal of the feedback circuit and has the terminal for driving the power transistor itself connected to one input terminal of the feedback circuit. In this arrangement, when the power transistor is made conductive from a nonconductive condition, the power transistor is subjected to a Miller effect and the fall time of the power transistor from the nonconductive condition to the conductive condition is delayed thereby to reduce the voltage generated in the secondary side of the ignition coil. In this case, since a voltage change in the primary side of the ignition coil is made slow and since the generation of a high voltage in the secondary side is also suppressed at the instant of energization of the primary side, an early ignition is prevented. On the other hand, when the power transistor is made nonconductive from the conductive condition, the Miller effect does not affect the power transistor and the rise time of the output of the power transistor remains normal. Thus, a secondary side voltage of the ignition coil is generated normally. Furthermore, when the collector voltage of the power transistor rises to an over voltage exceeding a predetermined level, the constant voltage diode renders a path between the collector of the power transistor and the terminal for driving the power transistor conductive. As a result, only a portion of the collector voltage which exceeds the constant voltage determined by the constant voltage diode is fed back to the base of the power transistor, and the breakdown between the collector and the emitter of the power transistor is prevented. Thus, the breakdown of the power transistor due to the excessive rise of the collector voltage can be prevented by a simple construction.

In the case of an independent ignition system employing four ignition coils (six coils in the case of six cylinders), or a double coil ignition system for internal combustion engines of automobiles wherein no high voltage distributor is involved, the ignition coil is usually made conductive during an intake stroke or during a compression stroke, and a voltage of 2,000 to 3,000 volts would otherwise be generated in the secondary side of the ignition coil at the time of conduction. Where the present invention is applied to these ignition systems, such a disadvantage can be prevented.

DESCRIPTION OF THE PREFERRED EMBODIMENT

Figure 1:
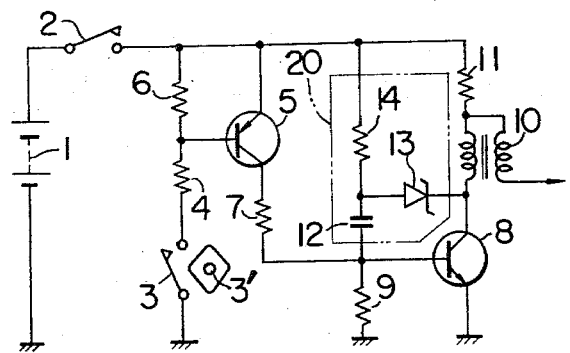
FIG. 1 is an electrical circuit diagram showing a first embodiment of this invention.

FIG. 1 shows a first embodiment of this invention. The negative pole of a battery 1 is connected to ground. One terminal of a keyswitch 2 is connected to the positive pole of battery 1. A contact 3 provided in a well-known distributor has one terminal connected to ground and the other terminal connected to one end of a resistor 4. This contact 3 is opened and closed by a cam 3' rotatably driven by the output shaft of an internal combustion engine. The other end of this resistor 4 is connected to the base of a PNP transistor 5. The emitter of this transistor 5 is connected to the other terminal of the above-mentioned keyswitch 2. A resistor 6 is connected between the emitter and the base of the transistor 5. The collector of the transistor 5 is connected to one end of a resistor 7 and the other end of the resistor 7 is connected to the base of an NPN power transistor 8. A resistor 9 is connected between the base and the emitter of the power transistor 8. One terminal of a capacitor 12 is connected to the base of the power transistor 8 and the other terminal to the anode of a constant voltage diode 13 and the cathode of the constant voltage diode 13 is connected to the collector of the above-mentioned power transistor 8. One end of a resistor 14 is connected to the anode of the above-mentioned constant voltage diode 13 and the other end to the positive pole of the battery 1. A feed-back circuit 20 comprises of the capacitor 12, the constant voltage diode 13 and the resistor 14. The collector of the power transistor 8 is connected to one end of the primary winding of an ignition coil 10 as a load. The other end of the primary winding of the ignition coil 10 is connected to one end of a resistor 11 commonly with one end of the secondary winding. The other end of the resistor 11 is connected to the other terminal of the keyswitch 2. The other end of the secondary winding of the ignition coil 10 is connected to an ignition plug through a high voltage distributor (not shown), or without the high voltage distributor.

The operation in the above construction will be explained referring to FIGS. 1 and 2. The contact 3 of the distributor is alternately opened and closed in accordance with the engine's rotation. As a result, the transistor 5 becomes conductive when the contact 3 is closed from an open position at a time $t_1$ to decrease the base voltage of the transistor 5 as shown in (A) of FIG. 2, and an electric current flows through the resistor 7 and the base-emitter of the power transistor 8. Thus, the power transistor 8 tends to become conductive. However, at this time, since electric current flows into the collector of the power transistor 8 through the capacitor 12 and constant voltage diode 13 in the feedback circuit 20 due to the Miller integrator effect, the rise of the base voltage of the power transistor 8 is suppressed and a voltage waveform at the collector of the power transistor 8 becomes a gradually reduced sawtooth waveform as shown in (B) of FIG. 2. Consequently, a voltage change, that is, an exciting current change in the primary winding of the ignition coil 10 occuring at the time of conduction of the power transistor 8 is suppressed to change slowly. As a result, a voltage generated in the secondary winding of the ignition coil 10 is reduced as shown in (C) of FIG. 2 and no spark is produced at the ignition plug thereby preventing early ignition. A time period during which the voltage variations are suppressed to occur slowly is 200 μsec in this embodiment. The values of the resistor 9, the capacitor 12 and the resistor 14 are 3.3 Ω, 15 μF and 270 Ω respectively.

Figure 2:
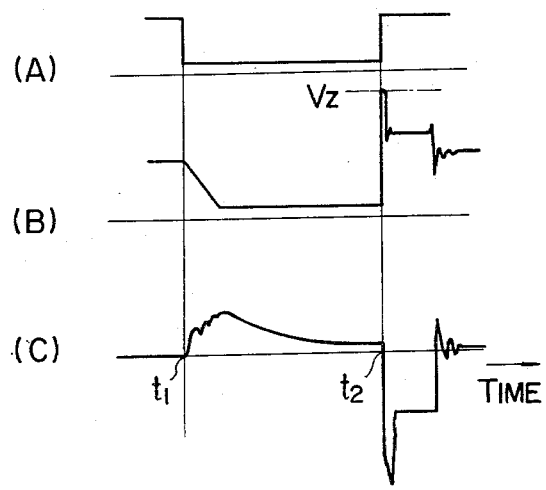
FIG. 2 shows voltage waveforms generated at various points in the diagram of FIG. 1.

Then, when the contact point 3 is opened at a time $t_2$, the base voltage of the transistor 5 is increased as shown in (A) of FIG. 2. Accordingly, on the contrary, due to the Miller integrator effect, an electric current tends to flow to the base of the transistor 8 through the constant voltage diode 13 and the capacitor 12 from the collector of the transistor 8. However, since the electric current is interrupted by the constant voltage diode 13, the non-conduction of the transistor 8 is not delayed. That is, the collector voltage of the transistor 8 rises sharply as shown in (B) of FIG. 2. Thus, the electric current in the primary coil 10 is instantly interrupted and a high voltage is generated in the secondary winding of the ignition coil 10 as shown in (C) of FIG. 2 to produce a spark at the ignition plug.

In this case, on account of a leakage inductance existing in the primary winding of the ignition coil 10, an excessively high voltage above the breakdown voltage $V_Z$ of the constant voltage diode 13 is apt to be generated at the collector of the transistor 8. However, since the constant voltage diode 13 becomes conductive to allow a basic current to flow to the transistor 8 through the capacitor 12, a collector current flows to the transistor 8 thereby to prevent the collector voltage ((B) in FIG. 2) of the transistor 8 from rising excessively.

Since the breakdown voltage $V_Z$ of the constant voltage diode 13 is made lower than the breakdown voltage between the collector and the emitter of the transistor 8, or between the collector and the base, the breakdown of the transistor 8 due to the rise of the collector voltage excessively as mentioned above can be prevented.

Figure 3:
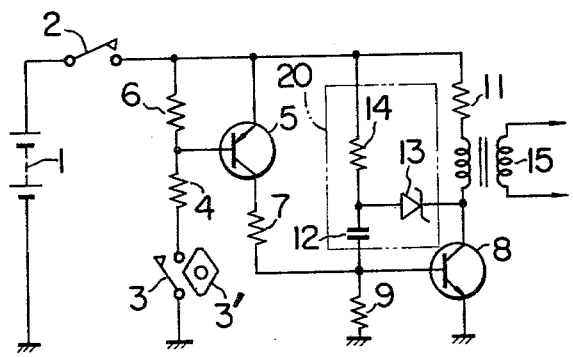
FIG. 3 is an electrical circuit diagram showing a second embodiment of this invention.

FIG. 3 shows a second embodiment of this invention. As compared with FIG. 1 showing the above-mentioned first embodiment, the ignition coil 10 in FIG. 1 is changed to an ignition coil 15. This ignition coil 15 is a double ignition coil having a secondary winding connected with two ignition plugs provided in each cylinder without intervention of a high voltage distributor between the secondary winding and the ignition plugs. Furthermore, the secondary winding for generating a high voltage is completely insulated from the primary winding. For this reason, the secondary winding voltage is different depending on a condition at the time of termination of the discharge. Accordingly, the suppression of the irregular high voltage generated in the secondary winding when the primary winding of the ignition coil 15 is energized, is achieved more effectively by the use of the feedback circuit 20 comprising a capacitor 12, a constant voltage diode 13 and a resistor 14 than the case of the above-mentioned ignition coil in FIG. 1.

Furthermore, although, in the first and second embodiments, the collector of the power transistor 8 is connected to the output of the feedback circuit 20, and the base is connected to one input of the feedback circuit 20, and the other input of the feedback circuit 20 is connected to the keyswitch 2 as a power source terminal, it will be apparent that the same operation can be achieved by changing the connections in such that the one input of the feedback circuit is connected to the collector of transistor 5, and the other input is connected to the junction point of the resistor 11 and the ignition coil 10, 15.

Figure 4:
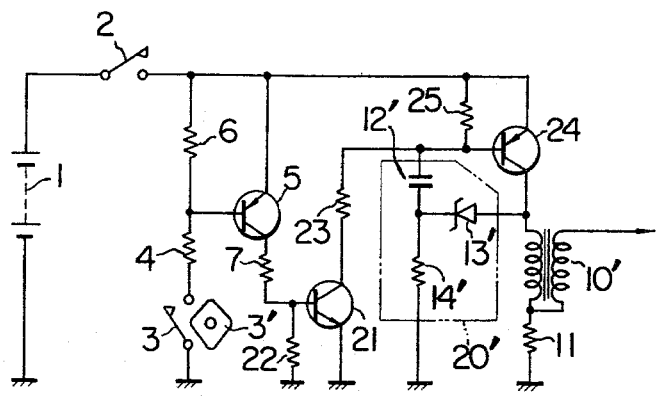
FIG. 4 is an electrical circuit diagram showing a third embodiment of this invention.

FIG. 4 shows a third embodiment in which an ignition coil is driven by a PNP transistor. In FIG. 4, since the connection and operation of a battery 1, keyswitch 2, contact 3 provided in a distributor, cam 3', PNP transistor 5 and resistor 7 are completely the same as that shown in FIG. 1, an explanation is omitted. The base of a transistor 21 is connected to the other end of the above-mentioned resistor 7 and the collector to the base of a PNP type power transistor 24 through a resistor 23. A resistor 22 is inserted between the base of the above-mentioned transistor 21 and ground. 20' is a feedback circuit and is comprised of a capacitor 12', a constant voltage diode 13' and a resistor 14', and one terminal of the capacitor 12' is connected to the base of the above-mentioned power transistor 24 and the other terminal to the cathode of the constant voltage diode 13'. The anode of the constant voltage diode 13' is connected to the collector of the power transistor 24. One end of the resistor 14' is connected to the other terminal of the capacitor 12' and the other end is connected to ground. The emitter of the power transistor 24 is connected to the other terminal of the keyswitch 2 and the collector of the power transistor 24 is connected to one end of the primary winding of an ignition coil 10'. A resistor 25 is inserted between the emitter and base of the power transistor 24. The other end of the primary winding of the ignition coil 10' is connected to one end of a resistor 11 commonly with one end of the secondary winding. The other end of the resistor 11 is connected to ground. The other end of the secondary winding of the ignition coil 10' is connected to the ignition plug through a high voltage distributor (not shown), or not through the same. Furthermore, the secondary winding of the ignition coil 10' is reversely wound in contrast to the secondary winding of the ignition coil 10.

In operation, the contact 3 of the distributor is opened and closed alternately with the engine's rotation. As a result when the contact 3 is closed from an open position at a time $t_1$, the transistor 5 is rendered conductive, and a current flows to the base of the transistor 21 through the resistor 7 causing the transistor 21 to become conductive with the increased base voltage shown in (A) of FIG. 5. Consequently, a current flows to the collector of transistor 21 from the emitter of the power transistor 24 through the base and resistor 23. Accordingly, the power transistor 24 tends to become conductive. At this time, due to the Miller integrator effect, a current flows from the collector of the power transistor 24 to the base thereof through a constant voltage diode 13' and a capacitor 12' in the feedback circuit 20. Thus, the fall of the base voltage of the power transistor 24 is suppressed, and a voltage waveform generated at the collector of the power transistor 24 becomes a sawtooth waveform increasing gradually as shown in (B) of FIG. 5, and a voltage change in the primary winding of the ignition coil 10' at the time of conduction of the power transistor 24 is made gradual. As a result, a voltage generated at the time $t_1$ in the secondary winding of the ignition coil 10' is reduced as shown in (C) of FIG. 5 and no spark is produced at the ignition plug, and the early ignition can be prevented. And after a certain time elapses, the electric charge accumulated on the capacitor 12' is discharged through the resistor 14. A time period during which the voltage change is made gradual is 200 $\mu$sec and is about the same as in the first embodiment. The values of the resistor 25, capacitor 12' and resistor 14' are 3.3 $\Omega$, 15 $\mu$F and 270 $\Omega$ respectively.

Figure 5:
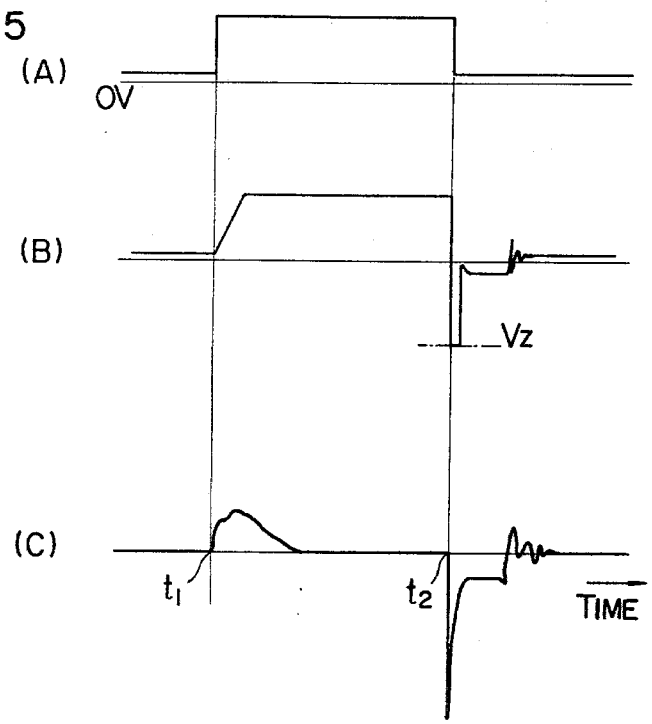
FIG. 5 shows voltage waveforms generated at various points in the diagram of FIG. 4.

When, the contact 3 is opened at a time $t_2$, the transistor 21 tends to become nonconductive with the decreased base voltage shown in (A) of FIG. 5. Accordingly, due to the Miller integrator effect, a current will flow from the base of the power transistor 24 to the collector thereof through the capacitor 12' and the constant voltage diode 13'. However, since the current is interrupted by the constant diode 13' the nonconduction of the power transistor 24 is effected without delay and the collector voltage of the transistor 24 changes sharply as shown in (B) of FIG. 5. Thus, the current in the primary winding of the ignition coil 10' is blocked instantly and a high voltage is generated in the secondary winding of the ignition coil 10' as shown in (C) of FIG. 5 to produce a spark at the ignition plug. At this time, due to a leakage inductance existing in the primary winding of the ignition coil 10' an excessively high voltage over the breakdown voltage $V_Z$ of the constant voltage diode 13' tends to be generated at the collector of transistor 24. Hereupon, the constant voltage diode 13' becomes conductive and a current flows to the base of transistor 24 through the capacitor 12 to cause a collector current to flow thereby to prevent the collector voltage of transistor 24 from rising excessively.

We claim:

1. An apparatus for controlling an ignition system having an ignition coil including a primary winding operatively connected to an electric power source and a secondary winding coupled to a spark plug, said apparatus comprising:
   input circuit means for generating a train of pulse signals having first and second magnitudes;
   output transistor means having base, collector, and emitter electrodes, said base electrode being connected to the output of said input circuit means and having an emitter-collector path connected in series with one end of said primary winding, said output transistor means being rendered conductive and nonconductive in response to said first and second magnitudes of said pulse signals to thereby energize and deenergize said primary winding of said ignition coil, respectively; and
   feedback circuit means comprising:
   a series circuit capacitor and constant voltage diode coupled between said base electrode and said collector electrode of said output transistor means, and
   a resistor having one end connected to the junction formed by the series connection of said capacitor and said constant voltage diode and the other end connected to the opposite end of said primary winding with respect to the end coupled in series with the emitter-collector path of said output transistor means,
   said series circuit capacitor and constant voltage diode allowing a current to flow from said base to said collector of said output transistor means at its transition from nonconduction to conduction thereby gradually increasing a current flowing from said electric power source to said primary winding of said ignition coil thereby reducing a voltage induced in said secondary winding,
   said series circuit capacitor and constant voltage diode blocking a reverse current from flowing from said collector to said base of said output transistor means at its transition from conduction to nonconduction thereby instantly cutting off current flowing through said primary winding and producing a high voltage in said secondary winding, said constant voltage diode being caused to break down when a high voltage exceeding a breakdown voltage thereof is developed at said collector of said output transistor means.

2. An apparatus according to claim 1, wherein said capacitor is connected to said base electrode of said output transistor means, wherein the cathode of said constant voltage is connected to said collector electrode of said output transistor means, and wherein said resistor is connected in parallel relation with said primary winding of said ignition coil and said constant voltage diode.

3. An apparatus according to claim 1, wherein said capacitor is connected to said base electrode of said output transistor means, wherein the anode of said constant voltage diode is connected to said collector electrode of said output transistor means, and wherein said resistor is connected in parallel relation with said primary winding of said ignition coil and said constant voltage diode.

* * * * *